United States Patent [19]

Lindmayer

[11] 4,149,903
[45] Apr. 17, 1979

[54] HYBRID SOLAR ENERGY COLLECTING DEVICE

[75] Inventor: Joseph Lindmayer, Rockville, Md.

[73] Assignee: Solarex Corporation, Rockville, Md.

[21] Appl. No.: 909,677

[22] Filed: May 25, 1978

[51] Int. Cl.² .......................... H01L 31/04; F24J 3/02
[52] U.S. Cl. .............................. 136/89 PC; 126/270; 126/271; 136/89 HY
[58] Field of Search ...................... 136/89 PC, 89 HY; 126/270, 271

[56] References Cited

U.S. PATENT DOCUMENTS

| | | | |
|---|---|---|---|
| 2,946,945 | 7/1960 | Regnier et al. | 320/2 |
| 2,989,575 | 6/1961 | Wallace, Jr. | 136/89 |
| 3,976,508 | 8/1976 | Mlavsky | 136/89 |
| 3,988,166 | 10/1976 | Beam | 136/89 |
| 4,002,031 | 1/1977 | Bell | 60/641 |
| 4,045,246 | 8/1977 | Mlavsky et al. | 136/89 PC |
| 4,056,405 | 11/1977 | Varadi | 136/89 PC |
| 4,080,221 | 3/1978 | Manelas | 136/89 PC |
| 4,090,359 | 5/1978 | Doellner | 60/39.69 R |
| 4,095,997 | 6/1978 | Griffiths | 136/89 HY |
| 4,106,952 | 8/1978 | Kravitz | 136/89 HY |

FOREIGN PATENT DOCUMENTS

| | | | |
|---|---|---|---|
| 2523479 | 12/1976 | Fed. Rep. of Germany | 136/89 PC |
| 2622511 | 12/1977 | Fed. Rep. of Germany | 136/89 PC |

*Primary Examiner*—Aaron Weisstuch
*Attorney, Agent, or Firm*—Watson, Cole, Grindle & Watson

[57] ABSTRACT

A hybrid solar energy collecting device adapted to generate an electrical current from sunlight and also to collect in an electrically insulating fluid thermal energy generated by such cells. The solar energy collecting device comprises a duct adapted for guiding the flow of an electrically insulating fluid such as air, and one or more photovoltaic cells mounted on an electrically insulated portion of the exterior surface of the duct. At least one of the photovoltaic cells has a heat sink which extends into the interior of the duct and is adapted to be contacted by the electrically insulating fluid.

8 Claims, 3 Drawing Figures

HYBRID SOLAR ENERGY COLLECTING DEVICE

BACKGROUND OF THE INVENTION

The present invention is directed generally to solar energy collecting devices and is more particularly concerned with a hybrid solar energy collecting device which includes one or more photovoltaic cells and also includes means for collecting thermal energy from the cells by an electrically insulating fluid.

Solar energy collecting devices of the type including a plurality of photovoltaic cells and a water-cooled substrate for removing thermal energy from the cells have been known. However, in such devices, it is necessary to carefully electrically insulate the photovoltaic cells from the substrate and the cooling water so as to avoid shorting between cells. Such a construction for a solar energy device greatly increases the cost of the device both in materials for construction and in time for assembly.

SUMMARY OF THE INVENTION

It is therefore an object of the present invention to provide a solar energy collecting device which is of simple construction and can be easily and economically assembled.

Another object of the present invention is to provide a solar energy collecting device of the above characteristics which is capable of generating an electrical current from sunlight and which is also capable of collecting thermal energy generated from the sunlight.

Yet another object of the present invention is to provide a solar energy collecting device including photovoltaic cells which utilizes an electrically insulating fluid such as air for cooling of the cells.

Briefly, in its broader aspects, the present invention comprehends a solar energy collecting device comprising a duct adapted for guiding the flow of an electrically insulating fluid, at least a portion of the duct being of electrically insulating material, and one or more photovoltaic cells mounted on the exterior surface of the portion of the duct which is of electrically insulating material, at least one of the cells having a heat conducting means in the form of a heat sink that extends into the interior of the duct and is adapted to be contacted by electrically insulating fluid.

Further objects, advantages and features of the present invention will become more fully apparent from a detailed consideration of the arrangement and construction of the constituent parts as set forth in the following specification taken together with the accompanying drawing.

DETAILED DESCRIPTION OF THE PREFERRED EMBODIMENTS

Figure 1:
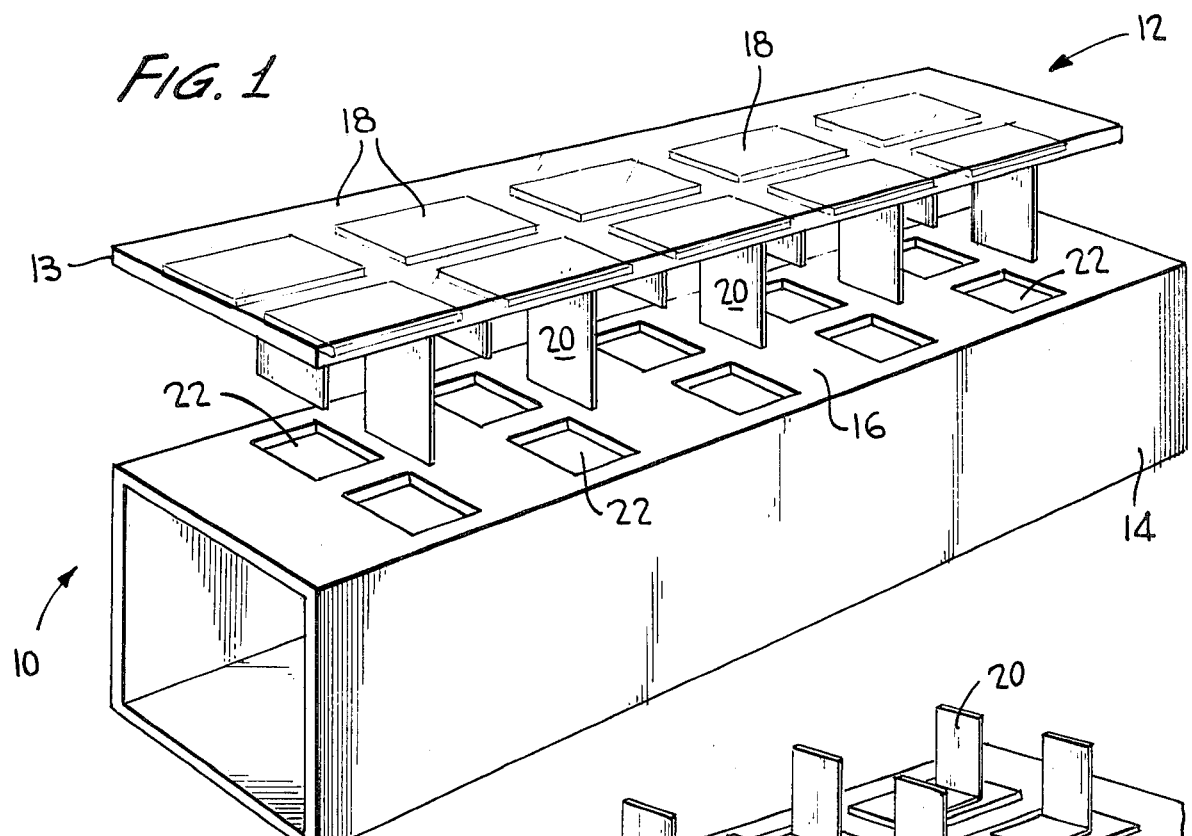
FIG. 1 is an exploded perspective view of one embodiment of a solar energy collector device in accordance with the present invention.

Referring now to FIG. 1, solar energy collector device 10 in accordance with the present invention includes panel member 12 and duct 14, the panel member adapted to be mounted on surface 16 of the duct. Panel member 12 includes one or more photovoltaic cells 18, commonly known as solar cells, which are capable of generating an electrical current when exposed to light. Cells 18 preferably are interconnected either in series or parallel and external electrical conductor means (not shown) are provided to electrically connect the cells to a load (not shown). Clearly the number of photovoltaic cells 18 shown on panel member 12 is for the purpose of illustration only as the present invention is adaptable for the use of any number of cells.

Photovoltaic cells 18 may be attached to or held within panel member 12 by a variety of means. In the embodiment shown, cells 18 have been adhesively mounted on the surface of a glass plate 13 such that the light receiving surface of each cell is covered by the plate so as to help protect the cells from adverse effects of the environment such as rain, air contaminants and the like. Alternatively, cells 18 may be encapsulated in a suitable light transmitting resin such as the silicone type resin encapsulating materials disclosed in my previously issued U.S. Pat. Nos. 4,057,439 and 4,093,473. Panel member 12 may further include reinforcing structures such as a frame or a substrate (not shown).

Figure 2:
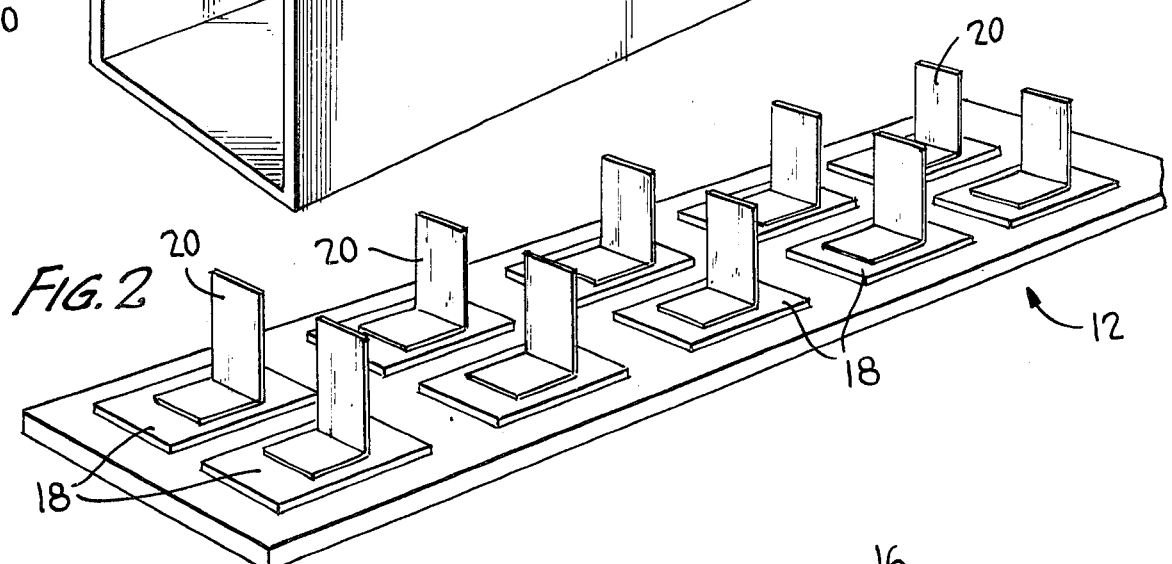
FIG. 2 is a perspective view of the under surface of a panel member forming a portion of the collector device of FIG. 1.

As is more clearly shown in FIG. 2 which is a perspective view of the under surface of panel member 12, each photovoltaic cell 18 has a heat conducting means 20 extending therefrom. Preferably, heat sink 20 for cell 18 is an L-shaped tab of metal, one leg of the L-shaped tab being contiguous and in contact with a major surface of the cell and the other leg of the L-shaped tab extending in a direction aproximately perpendicular to the surface of the cell. Preferably, heat conducting means 20 is of a copper containing material and is soldered to photovoltaic cell 18 to insure good heat transfer from the cell to the heat conducting means.

It should be emphasized that other configurations for the heat conducting means 20 than the configuration shown are contemplated by the present invention. For example, heat conducting means 20 could comprise a rod having a plurality of fins or a plate having surface irregularities such as projections, ridges, arms and the like.

Duct 14 is adapted for guiding and confining the flow of an electrically insulating fluid such as air. At least surface 16 of duct 14 where panel member 12 is to be mounted is of an electrically insulating material. Preferably, the entirety of duct 14 is of an electrically insulating material such as a synthetic polymer material which can be economically extruded or molded into the desired shape. In the embodiment shown in FIG. 1, duct 14 has a rectangular cross-section. It should be realized that other configurations for duct 14 may be equally applicable to the concepts of the present invention.

Surface 16 of duct 14 is provided with a plurality of openings 22, the openings located on the surface such that the portions of heat conducting means 20 projecting from panel member 12 can extend into the interior of the duct. As is evident, the size of openings 22 is not critical, the only requirement being that heat conducting means 20 can extend therethrough. Openings 22 may be formed in duct 14 by a number of methods such as by forming the openings simultaneously with molding of the duct or by punching or cutting after the duct has been formed.

Preferably, the major surfaces of heat conducting means 20 are oriented within duct 14 such that these surfaces are transverse to the longitudinal axis of the duct. Such an orientation of the heat conducting means 20 creates greater turbulence in a fluid flowing through duct 14 and thus heat transfer to the fluid is facilitated.

Figure 3:
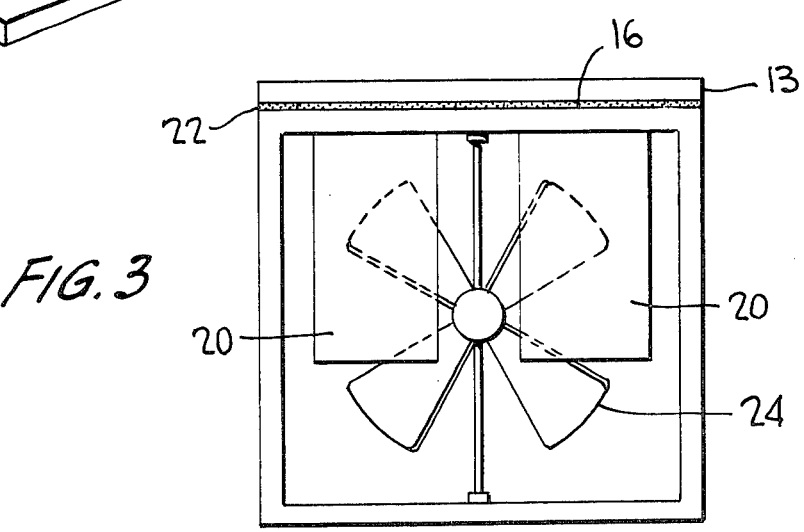
FIG. 3 is an end view of the assembled collector device of FIG. 1.

The function of collector device 10 can be more clearly shown by reference to FIG. 3. Here glass plate 13 has been mounted on surface 16 of duct 14 by an electrically insulating adhesive 22 such that heat conducting means 20 from cells 18 extend into the interior of the duct. Thus when cells 18 are exposed to sunlight, the thermal heat generated in glass plate 13 is transferred by heat conducting means 20 to a fluid flowing within duct 14.

Since a fluid flowing through duct 14 comes in contact with all of the heat conducting means 20 of the cells 18, the fluid must be electrically insulating so as to prevent the cells from being shorted to each other. A presently preferred electrically insulating fluid is air due to, among other things, its high breakdown voltage.

The flow of electrically insulating fluid within duct 14 can be produced by a variety of means. For example, if the longitudinal axis of duct 14 is inclined with respect to the horizontal, the heat transferred by heat conducting means 20 to a gaseous fluid within the duct by convection will cause the fluid to flow from the lower end to the upper end of the duct. Alternatively, mechanical means 24, such as a fan, blower or the like may be incorporated into collector device 10 to create a flow of fluid. Rather than using adhesive 22 for mounting panel 12 to surface 16 of duct 14, alternatively, mechanical means such as clips, screws, bolts and the like may be used. Furthermore, if an encapsulating resin is used to retain cells 18 within panel member 12, the encapsulating resin may be applied directly to surface 16 of duct 14 so as to affix the cells of the duct.

While the heat transfer from photovoltaic cells 18 to the fluid by heat transfer means 20 may simply be used to maintain the temperature of the cells at acceptable levels by exhausting the heated fluid, preferably the energy of the heated fluid is utilized in some manner such as in power generation, direct heating, water heating and the like. Such uses and means for accomplishing these uses will be apparent to one of ordinary skill in the art. When device 10 is used in this manner, preferably duct 14 is made entirely of a polymer-type material so as to reduce thermal losses from the fluid flowing through the duct. Where additional uses are to be made of the heat transferred to the air or other fluid, special structures can be devised, such as providing an additional glass plate above and spatially separated from the glass 13 to take advantage of the greenhouse effect. Also, it will be understood that the herein described device may be used in conjunction with light-concentrating apparatus.

While there has been shown and described what is considered to be a preferred embodiment of the present invention, it will be obvious to those skilled in the art that various changes and modifications may be made therein without departing from the invention as defined in the appended claims.

I claim:

1. A solar energy collecting device, comprising a duct adapted for guiding the flow of an electrically insulating fluid, at least a portion of said duct being formed from electrically insulating material, and at least one photovoltaic cell mounted on said portion, said at least one cell having heat conducting means extending into the interior of said duct to a position in which it is adapted to be contacted by said electrically insulating fluid.

2. A device according to claim 1, further including means for providing a flow of said electrically insulating fluid through said duct.

3. A device according to claim 1, wherein said heat conducting means of said at least one cell extends through an aperture in the exterior surface of said duct.

4. A device according to claim 1, wherein said heat conducting means is a heat sink.

5. A device according to claim 4, wherein said heat sink is an L-shaped tab, one leg of said tab extending into the interior of said duct.

6. A device according to claim 1, further including a panel member secured to one surface of said duct, said panel member being formed of electrically insulating material and having means to receive said at least one cell in a position in which said cell heat conducting means extends through said panel member and said duct surface into the interior of said duct.

7. A device according to claim 1, further including means for concentrating light on said at least one photovoltaic cell.

8. A device according to claim 2, in which said electrically insulating fluid is air.

* * * * *